United States Patent
Matsukura

(10) Patent No.: US 7,399,988 B2
(45) Date of Patent: Jul. 15, 2008

(54) PHOTODETECTING DEVICE AND METHOD OF MANUFACTURING THE SAME

(75) Inventor: Yusuke Matsukura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/581,583

(22) Filed: Oct. 17, 2006

(65) Prior Publication Data

US 2007/0262292 A1 Nov. 15, 2007

(30) Foreign Application Priority Data

May 10, 2006 (JP) .............................. 2006-131159

(51) Int. Cl.
 *H01L 29/06* (2006.01)
(52) U.S. Cl. .............................. 257/23; 257/14; 257/21; 257/E29.071; 977/774; 438/48; 438/590
(58) Field of Classification Search ................... None
See application file for complete search history.

(56) References Cited

U.S. PATENT DOCUMENTS 6,885,023 B2 * 4/2005 Shields et al. ................. 257/21

FOREIGN PATENT DOCUMENTS

| JP | 2000-275692 | 10/2000 |
|---|---|---|
| JP | 2000-323742 | 11/2000 |
| JP | 2003-218366 | 7/2003 |

OTHER PUBLICATIONS

V. Ryzhii; "The theory of quantum-dot infrared phototransistors;" *Semicond. Sci. Technol.*; vol. 11; 1996; pp. 759-765./Discussed in the specification.

* cited by examiner

*Primary Examiner*—Sue A. Purvis
*Assistant Examiner*—Scott R Wilson
(74) *Attorney, Agent, or Firm*—Kratz, Quintos & Hanson, LLP

(57) ABSTRACT

A photodetecting device which is capable of performing photodetection with a high sensitivity in a wide temperature range. A quantum dot structure including an embedding layer and quantum dots embedded by the embedding layer is formed. A quantum well structure including embedding layers and a quantum well layer whose band gap is smaller than those of the embedding layers is formed at a location downstream of the quantum dot structure in the direction of flow of electrons which flow perpendicularly to the quantum dot structure during operation of the photodetecting device. This reduces the temperature dependence of the potential barrier of a photodetecting section, which has to be overcome by electrons, whereby it is possible to lower the potential barrier of the embedding layers at high temperature.

10 Claims, 6 Drawing Sheets

105b POTENTIAL ENERGY OF QUANTUM DOT

PHOTODETECTING DEVICE AND METHOD OF MANUFACTURING THE SAME

CROSS-REFERENCE TO RELATED APPLICATIONS

This application is based upon and claims the benefits of priority from the prior Japanese Patent Application No. 2006-131159, filed on May 10, 2006, the entire contents of which are incorporated herein by reference.

BACKGROUND OF THE INVENTION

1. Field of the Invention

This invention relates to a photodetecting device and a method of manufacturing the same, and more particularly to a photodetecting device having quantum dots and a method of manufacturing the same.

2. Description of the Related Art

Conventionally, there has been used a photodetecting device that uses a quantum well structure having quantum well layers in a photodetecting section thereof (see e.g. Japanese Unexamined Patent Publication No. 2000-323742).

The photodetecting device has become capable of detecting infrared light having a wavelength of 10 μm or so, which had been considered difficult to detect, by using the quantum well layers made of e.g. a gallium arsenide (GaAs)-based semiconductor material.

However, the photodetecting device employing the quantum well structure does not detect light which is incident perpendicularly to the layer surfaces of the quantum well layers. To solve this problem, the photodetecting device was required to be provided with a contrivance, such as a special optical device or diffraction grating, for making the incident light substantially parallel to the layer surfaces of the quantum well layers. This resulted in the complicated construction of the photodetecting device, and increased manufacturing costs thereof. On the other hand, the photodetecting device employing the quantum well structure suffered from the problem that dark current, which can be a noise source, is exponentially increased with respect to the operating temperature of the photodetecting device. Therefore, it is difficult for the photodetecting device to operate at a temperature of 300K, which is essential in putting the device to use, and hence it was necessary to cool the device to a temperature at which the adverse influence of the dark current can be made negligible. This also brought about the problem of increased cooling costs of the device.

To cope with these problems, a photodetecting device has been proposed which employs a quantum dot structure having quantum dots in place of the quantum well structure (e.g. see Semiconductor Science and Technology, 1996, Vol. 11, pp. 759 to 765).

The photodetecting device employing the quantum dot structure is capable of detecting light which is incident perpendicularly to the layer surfaces of the quantum dot structure of a photodetecting section thereof. Further, the probability that photoexcited carriers are captured again by the quantum dots is low, and hence it is expected that the photodetecting device can have a high photocurrent gain to achieve high sensitivity. Furthermore, if the quantum dot structure is used in the photodetecting section, it is expected that the signal current can be detected without being buried in the dark current even at a relatively high temperature. This makes it possible to simplify a cooling device for the quantum dot structure for controlling the dark current, and hence the downsizing of the photodetecting device and the reduction of cooling costs thereof can be expected.

However, when the photodetecting device employing the quantum dot structure is actually manufactured, the sensitivity of photodetection is suddenly degraded along with a rise in the temperature of the photodetecting section.

One of the causes of this degradation is the lowered probability of emission of electrons caused by the rise in the temperature of the photodetecting section. Hereinafter, a description will be given of the mechanism causing the lowering of the emission probability.

FIG. 5 is a schematic cross-sectional view of essential parts of a photodetecting device employing a quantum dot structure. FIG. 6 is a schematic diagram of the potential distribution of a conduction band of the photodetecting device shown in FIG. 5. The photodetecting device 100 shown in FIG. 5 comprises a substrate 101, a single embedding layer 102 formed over the substrate 101, and a quantum dot structure 105 which is formed over the single embedding layer 102 and includes quantum dots 105a and a single embedding layer 106 arranged in the mentioned order. FIG. 6 schematically shows the potential distribution of the conduction band of the photodetecting device with respect to the Fermi level taken on line X-X' of FIG. 5, in which are indicated the potential energy 105b of the quantum dots 105a, the Fermi level ($E_f$), a conduction band end potential ($E_{c1}$) at low temperature, and a conduction band end potential ($E_{c2}$) at high temperature.

Generally, a potential barrier $E_c - E_f$, which is the difference between a conduction band end potential ($E_c$) and the Fermi level $E_f$, and is produced by a semiconductor layer, can be expressed based on the charge neutral condition by the following equation (1):

$$E_c - E_f = k_b T \times ln(N_c/N_d) \quad (1)$$

In the this equation (1), $k_b$ represents a Boltzmann constant, T the temperature of a photodetecting section 100a, $N_c$ an effective density of state of the conduction band of the embedding layers 102 and 106, and $N_d$ an impurity concentration.

As can be understood from the equation (1), the potential barrier $E_c - E_f$ becomes larger in proportion to the temperature of the photodetecting section 100a. More specifically, it is apparent from FIG. 6 that the potential barrier in the vicinity of the quantum dot structure 105 becomes larger in proportion to a rise in the temperature of the photodetecting section 100a ($E_{c2} - E_f > E_{c1} - E_f$).

For this reason, in a process during which light energy is obtained from light absorbed by the quantum dot structure 105 of the photodetecting section 100a, and excited electrons are emitted as photocurrent, when the temperature of the photodetecting section 100a becomes higher, the potential barrier also becomes larger, and therefore the probability of emission of electrons becomes lower. This results in a sudden degradation of the sensitivity of photodetection by the photodetecting device 100.

SUMMARY OF THE INVENTION

The present invention has been made in view of the above-described problems, and an object thereof is to provide a photodetecting device which is capable of performing photodetection with a high sensitivity in a wide temperature range, and a method of manufacturing the same.

To attain the above object, in a first aspect of the present invention, there is provided a photodetecting device having quantum dots. The photodetecting device comprises a quantum dot structure including a first embedding layer, and quantum dots embedded by the first embedding layer, and a quantum well structure formed at a location downstream of the quantum dot structure in a direction of flow of electrons which flow perpendicularly to the quantum dot structure during operation of the photodetecting device, the quantum well structure including second and third embedding layers, and a quantum well layer which is sandwiched between the second and third embedding layers, and whose band gap is smaller than those of the second and third embedding layers.

To attain the above object, in a second aspect of the present invention, there is provided a method of manufacturing a photodetecting device having quantum dots. The method is characterized by comprising the steps of forming a quantum dot structure including a first embedding layer, and quantum dots embedded by the first embedding layer, and forming a quantum well structure at a location downstream of the quantum dot structure in a direction of flow of electrons which flow perpendicularly to the quantum dot structure during operation of the photodetecting device, the quantum well structure including second and third embedding layers, and a quantum well layer which is sandwiched between the second and third embedding layers, and whose band gap is smaller than those of the second and third embedding layers.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

The invention will now be described in detail with reference to drawings showing a preferred embodiment thereof.

First, a description will be given of the operating principles of a photodetecting device according to the invention.

Figure 1:
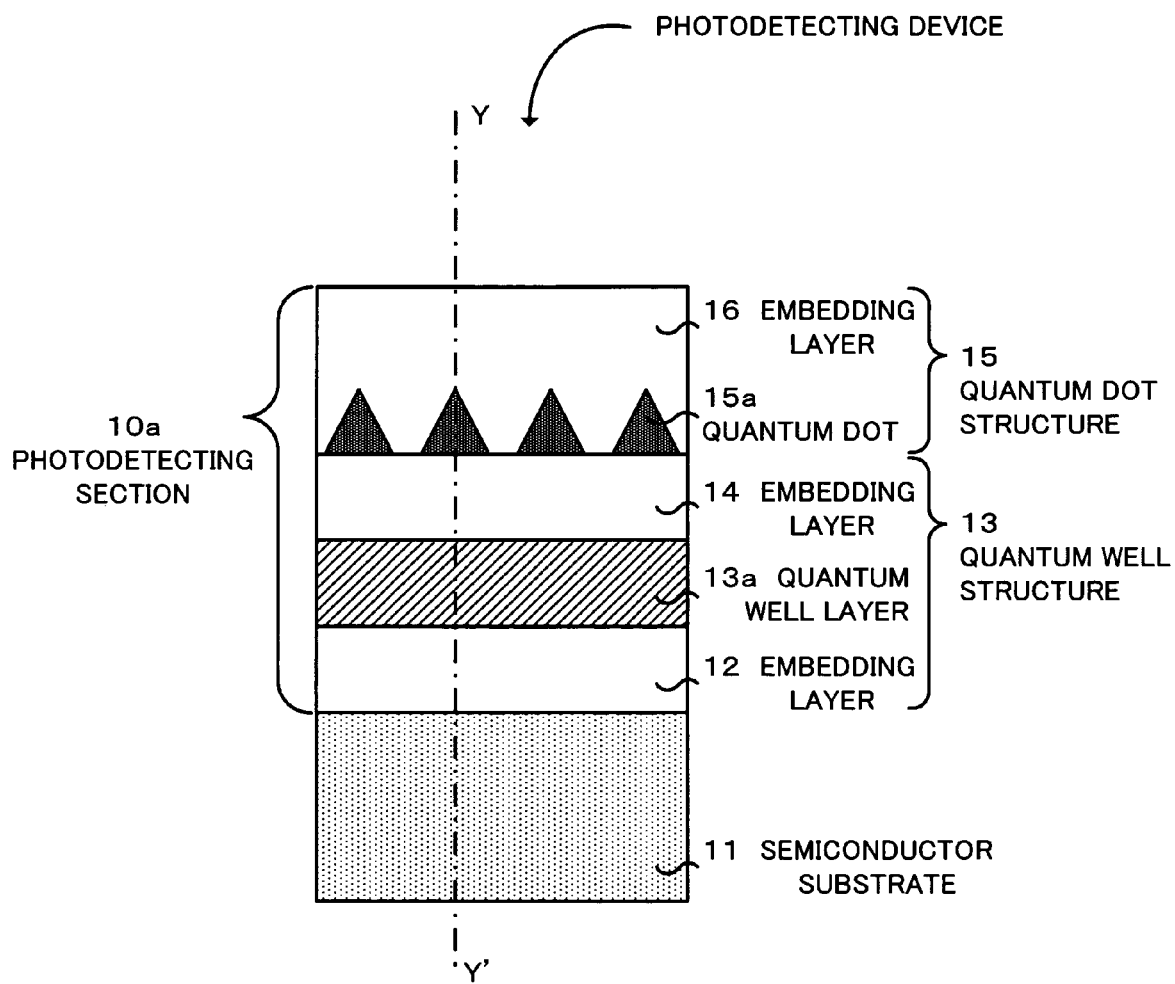
FIG. 1 is a schematic cross-sectional view of essential parts of the concept of a photodetecting device according to the invention.

FIG. 1 is a schematic cross-sectional view of essential parts of the concept of the photodetecting device.

Figure 5:
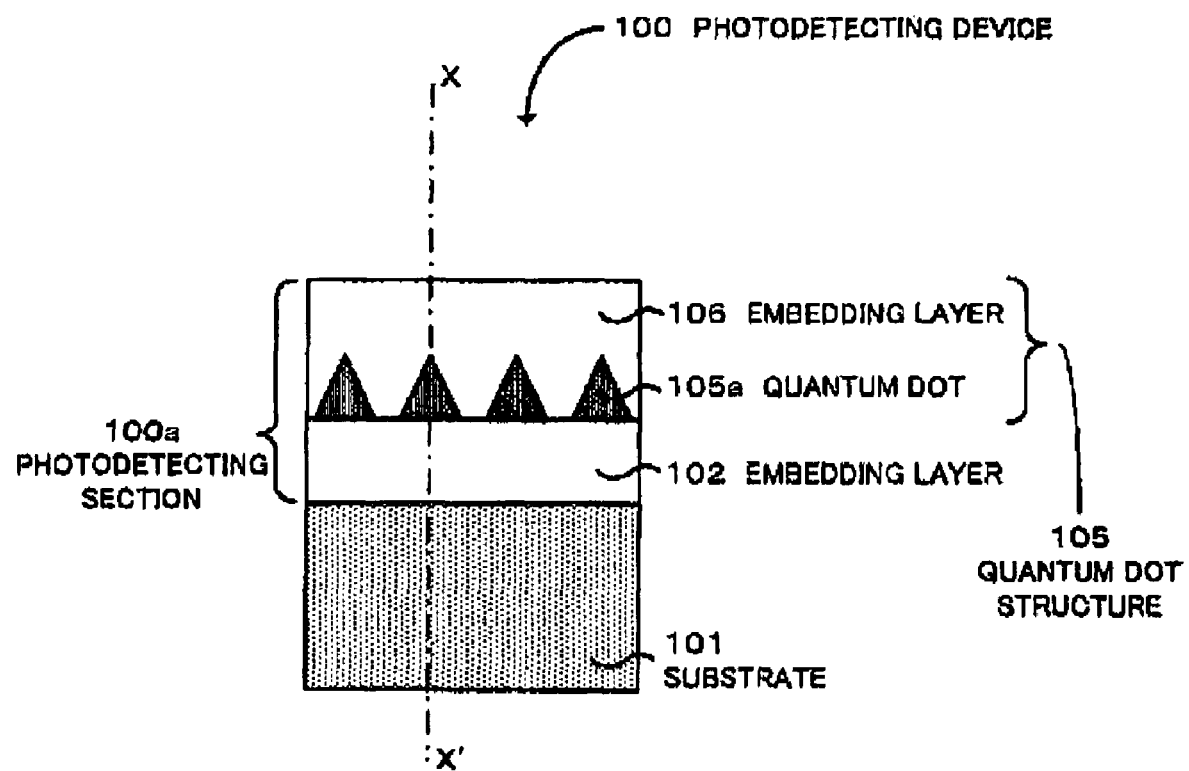
FIG. 5 is a schematic cross-sectional view of essential parts of a photodetecting device using a quantum dot structure.
Figure 6:
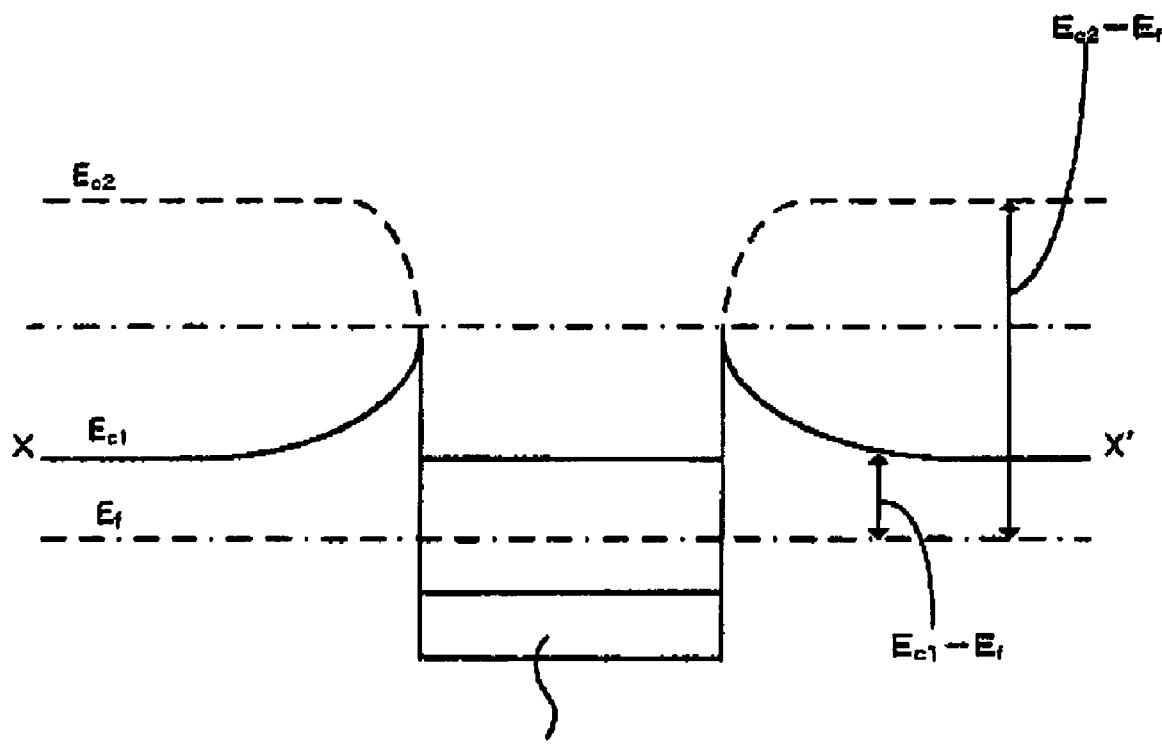
FIG. 6 is a schematic diagram of the potential distribution of a conduction band of the photodetecting device shown in FIG. 5.

The photodetecting device 10 comprises a semiconductor substrate 11, a quantum well structure 13 which is formed over the semiconductor substrate 11 and includes an embedding layer 12, a quantum well layer 13a, and an embedding layer 14, and a quantum dot structure 15 which is formed over the quantum well structure 13 and includes quantum dots 15a and an embedding layer 16 formed over the quantum dots 15a. It should be noted that as distinct from the photodetecting device 100 shown in FIG. 5, the photodetecting device 10 is provided with the quantum well layer 13a, and let it be assumed that the band gap of the quantum well layer 13a is smaller than those of the embedding layers 12 and 14.

It should be noted that the photodetecting device 10 constructed as described above is for causing electrons to flow downward in a direction perpendicular to the layer surfaces of the photodetecting device 10 during operation thereof.

Now, a brief description will be given of the relationship between the temperature and the potential barrier of a photodetecting section 10a of the photodetecting device 10 by taking a one-level system as an example, for simplicity.

In the photodetecting device 10, when an impurity is added to the quantum well layer 13a to an impurity concentration defined as $N_d$, the number n of electrons captured by a quantum level $E_i$ formed in the quantum well layer 13a is represented by $n=N_dL$, wherein L represents the width of the potential energy of the quantum well layer 13a, and further it can be expressed by the following equation (2):

$$n = 4\pi m k_B T/h^2 ln\{1+(E_F-E_i/K_BT)\} \quad (2)$$

In the above equation, m represents the effective mass of electrons, and h a Planck's constant.

At this time, the potential barrier $E_c-E_f$ can be expressed by the following equation (3):

$$E_c-E_f = E_c-E_i-k_BT \times ln\{exp(nh^2/4\pi mk_BT)-1\} \quad (3)$$

Figure 2:
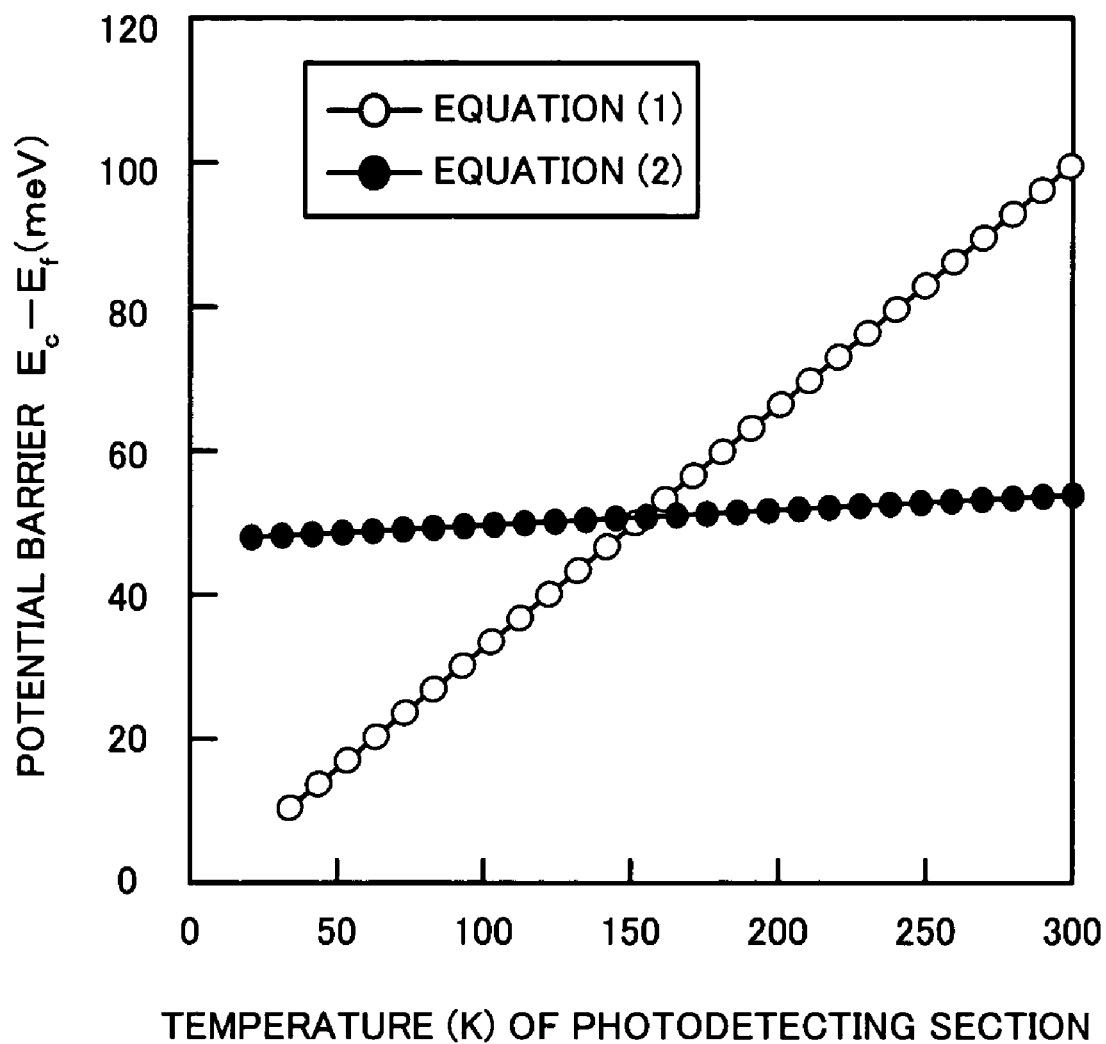
FIG. 2 is a diagram of the temperature dependence of a potential barrier of a photodetecting section.

FIG. 2 is a diagram showing the temperature dependence of the potential barrier of the photodetecting section. More specifically, assuming that $N_d=1\times10^{16}$ cm$^{-3}$, L=25 nm, m=0.067 $m_0$ ($m_0$: rest mass of electrons), and $E_c-E_i=137$ meV hold, the equation (1) and the equation (3) are compared with each other. According to the equation (1) indicated in FIG. 2, e.g. in the case of the photodetecting section 100a formed using the quantum dot structure 105 of the photodetecting device 100 shown in FIG. 5, the potential barrier $E_c-E_f$ of the photodetecting section 100a becomes higher in proportion to a rise in the temperature of the photodetecting section 100a. On the other hand, according to the equation (3) indicated in FIG. 2, it is understood that the potential barrier $E_c-E_f$ of the photodetecting section 10a of the photodetecting device 10 shown in FIG. 1, which is formed using the quantum dot structure 15 and the quantum well structure 13, is held approximately constant without becoming higher in proportion to a rise in the temperature of the photodetecting section 10a.

Figure 3:
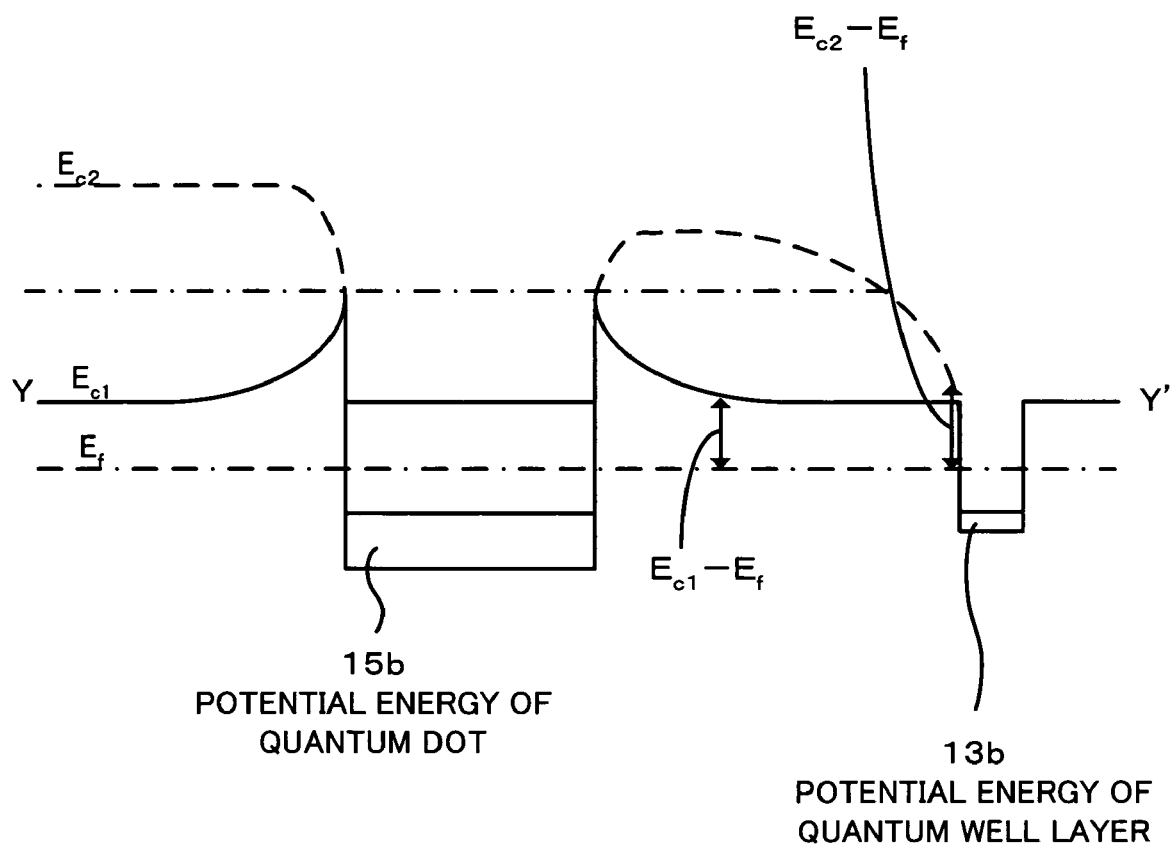
FIG. 3 is a schematic diagram of the potential distribution of a conduction band of the photodetecting device.

FIG. 3 is a schematic diagram of the potential distribution of a conduction band of the photodetecting device. FIG. 3 schematically shows the potential distribution of the conduction band of the photodetecting device with respect to the Fermi level taken on line Y-Y' of FIG. 1, in which are indicated the potential energy 15b of the quantum dots 15a, the potential energy 13b of the quantum well layer 13a, $E_f$, $E_{c1}$, and $E_{c2}$. Since the photodetecting device 10 is provided with the quantum well layer 13a whose band gap is smaller than those of the embedding layers 12 and 14, the height of a potential barrier $E_{c2}-E_f$, which has to be overcome by electrons when the temperature of the photodetecting section 10a is high, becomes smaller than that of the potential barrier of the photodetecting section 100a formed using the quantum dot structure 105.

From the above, by providing the quantum dot structure 15, and the quantum well structure 13 that includes the embedding layers 12 and 14 and the quantum well layer 13a whose band gap is smaller than those of the embedding layers 12 and 14 in the photodetecting section 10a, the photodetecting device 10 has a lower potential barrier in the embedding layer 14. More specifically, in the process during which light energy is obtained from light absorbed in the quantum dot structure 15 of the photodetecting section 10a, and excited electrons are emitted as photocurrent, the temperature dependence of the potential barrier that has to be overcome by electrons becomes lower, and therefore it is possible to prevent the sensitivity of photodetection by the photodetecting device 10 from being degraded even when the photodetecting device 10 is used under a high-temperature environment.

It should be noted that although the above description has been given of the construction in which electrons are caused to flow downward in the direction perpendicular to the layer surfaces of the photodetecting device 10 during operation of the photodetecting device, by way of example, this is not limitative, but when electrons are caused to flow upward in the direction perpendicular to the layer surfaces, the layers are formed in the reverse order. That is, the photodetecting device 10 is constructed such that the quantum dot structure 15 and the quantum well structure 13 are formed in the mentioned order from below over the semiconductor substrate 11.

Next, a detailed description will be given of a photodetecting device according to a preferred embodiment of the present invention.

Figure 4:
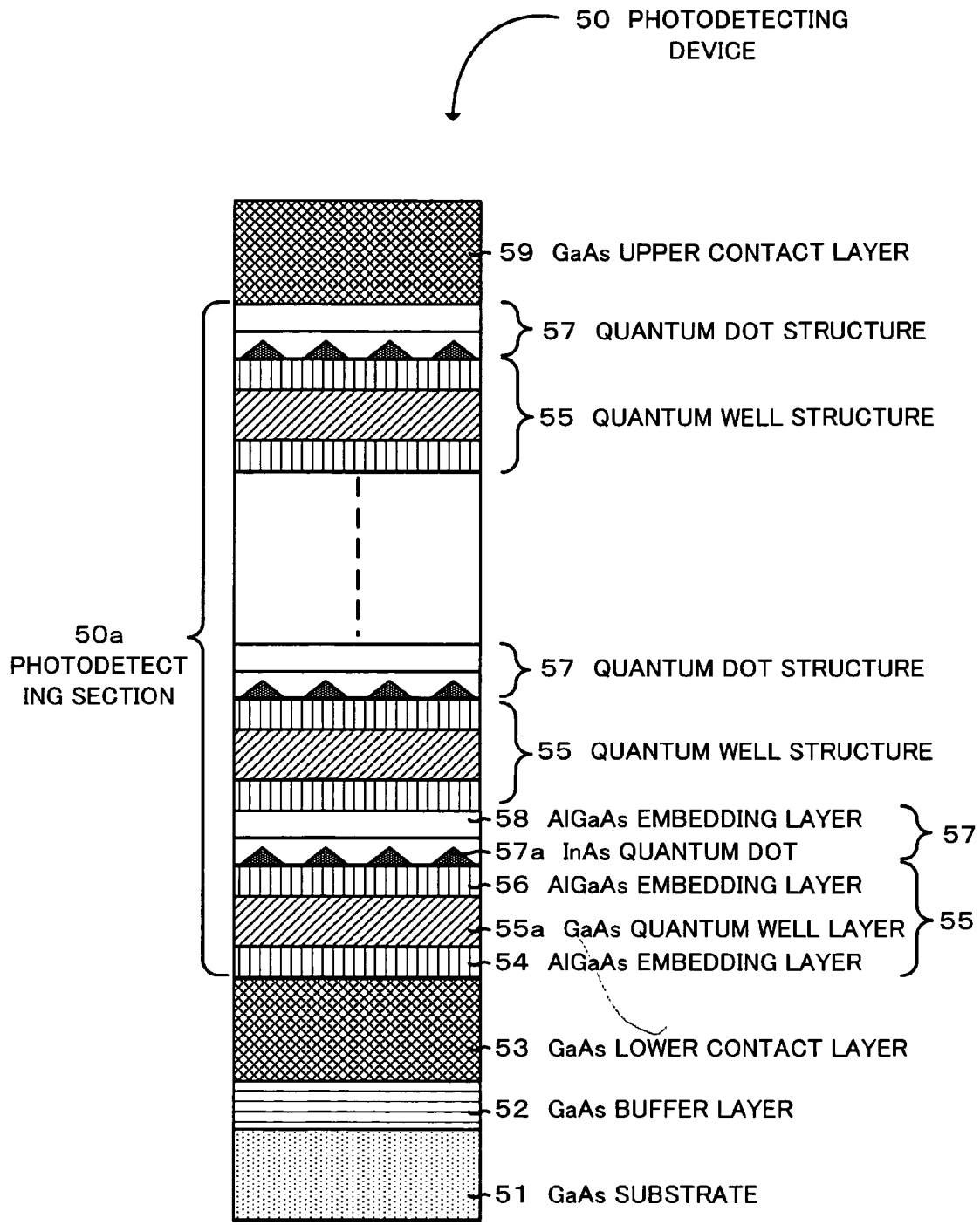
FIG. 4 is a schematic cross-sectional view of essential parts of a photodetecting device according to a preferred embodiment of the invention.

FIG. 4 is a schematic cross-sectional view of essential parts of the photodetecting device.

As shown FIG. 4, the photodetecting device 50 has a photodetecting section 50a constructed by forming a combination of a quantum well structure 55 and a quantum dot structure 57 a plurality of times in layers. It should be noted that FIG. 4 illustrates a construction of the photodetecting device 50, which causes electrons to flow downward in a direction perpendicular to the layer surfaces of the photodetecting device 50.

The photodetecting device 50 comprises a GaAs substrate 51, a GaAs buffer layer 52 formed over the GaAs substrate 51, a GaAs lower contact layer 53 formed over the GaAs buffer layer 52, a plurality of duplicate combinations of the quantum well structure 55 and the quantum dot structure 57 over the quantum well structure 55, which are formed over the GaAs lower contact layer 53, the quantum well structure 55 including an aluminum gallium arsenide (AlGaAs) embedding layer 54, a GaAs quantum well layer 55a, and an AlGaAs embedding layer 56, and the quantum dot structure 57 including indium arsenide (InAs) quantum dots 57a and an AlGaAs embedding layer 58, and a GaAs upper contact layer 59 formed over the uppermost quantum dot structure 57 of the duplicate combinations. The photodetecting device 50 having the above described construction is formed, for example, as follows:

First, the GaAs buffer layer 52 and the GaAs lower contact layer 53 are sequentially formed over the GaAs substrate 51 by molecular beam epitaxy (MBE). At this time, the GaAs buffer layer 52 and the GaAs lower contact layer 53 are formed such that the thicknesses of the GaAs buffer layer 52 and the GaAs lower contact layer 53 are 100 nm and 500 nm, respectively. Further, the GaAs lower contact layer 53 is doped with silicon (Si) such that the impurity concentration of the GaAs lower contact layer 53 becomes $1 \times 10^{18}$ cm$^{-3}$.

Then, the AlGaAs embedding layer 54, the GaAs quantum well layer 55a, and the AlGaAs embedding layer 56 are grown over the GaAs lower contact layer 53 by MBE at a substrate temperature of 580° C. such that the AlGaAs embedding layers 54 and 56 each have a thickness of 12.5 nm and an aluminum (Al) content of 15%, and the GaAs quantum well layer 55a has a thickness of 25 nm, whereby the quantum well structure 55 is formed. It should be noted that as mentioned hereinabove in the description of the concept of the photodetecting device according to the invention, the GaAs quantum well layer 55a is configured to have a band gap smaller than those of the AlGaAs embedding layers 54 and 56.

Subsequently, the InAs quantum dots 57a are formed over the quantum well structure 55 by employing the Stranski-Krasnotav (SK) growth mode and supplying InAs as a material in a total amount corresponding to 2.3 molecular layers at a supply rate of 0.1 molecular layer per second at a substrate temperature of 500° C. The formed InAs quantum dots 57a each had a height of 6.5 nm and a width of 35 nm in shape according to evaluation of a sample formed under the same growing condition. Then, the AlGaAs embedding layer 58 is formed as an embedding layer over the InAs quantum dots 57a by MBE at a substrate temperature of 580° C. such that the AlGaAs embedding layer 58 has a thickness of 12.5 nm and an Al content of 15%, whereby the quantum dot structure 57 is formed.

Then, the structure as a combination of the quantum well structure 55 and the quantum dot structure 57 is formed desired times, e.g. ten times, whereby a multi-layered quantum dot structure is formed.

Finally, the GaAs upper contact layer 59 having a thickness of 50 nm is formed over the uppermost layer of the multi-layered quantum dot structure, whereby the photodetecting device 50 is manufactured.

By forming electrodes and other required elements on the photodetecting device 50 manufactured as described above, by a known semiconductor processing technique, it is possible to manufacture a photodetector having the photodetecting device 50.

According to the photodetecting device 50 configured as above, it is possible to enhance the sensitivity of photodetection by forming the quantum dot structure 57 a plurality of times in layers, and reduce the temperature dependence of the Fermi level of the embedding layers by arranging the quantum dot structures 57 and the quantum well structures 55 in the photodetecting section 50a. More specifically, in the process in which electrons having obtained light energy from absorbed light are emitted from the quantum dot structures, the temperature dependence of the potential barrier that has to be overcome by the electrons becomes lower. This makes it possible to prevent the photodetecting section 50a from being degraded in the sensitivity of photodetection at high temperature. As a result, it is possible to realize a photodetecting device achieving high performance and high reliability when it is used at a relatively high operating temperature.

It should be noted that although in the above description of the construction of the photodetecting device 50, MBE has been described as a crystal growth method, by way of example, the same advantageous effects can be obtained e.g. by using metal organic chemical vapor deposition (MOCVD) as a known crystal growth method other than MBE. Further, as for the GaAs buffer layer 52, the GaAs lower and upper contact layers 53 and 59, the GaAs quantum well layer 55a, the AlGaAs embedding layers 54, 56, and 58, and the InAs quantum dots 57a, the material, the thickness, and the impurity concentration can be changed as desired according to the design of the photodetecting device 50. For example, for the InAs quantum dots 57a, indium gallium arsenide (InGaAs) may be used in place of InAs.

According to the photodetecting device of the present invention, a quantum dot structure including an embedding layer and quantum dots embedded by the embedding layer is formed, and a quantum well structure including embedding layers and a quantum well layer whose band gap is smaller than those of the embedding layers is formed at a location downstream of the quantum dot structure in the direction of flow of electrons which flow perpendicularly to the quantum dot structure during operation of the photodetecting device. This reduces the temperature dependence of the potential barrier of a photodetecting section, whereby it is possible to lower the potential barrier of the embedding layers at high temperature. This makes it possible to manufacture a photodetecting device which is capable of preventing the sensitivity of photodetection from being degraded when the photodetecting device is used under a high-temperature environment.

Further, according to a method of manufacturing the photodetecting device of the present invention, it is possible to form a quantum dot structure including an embedding layer and quantum dots embedded by the embedding layer, and form a quantum well structure including embedding layers and a quantum well layer whose band gap is smaller than those of the embedding layers at a location downstream of the quantum dot structure in the direction of flow of electrons which flow perpendicularly to the quantum dot structure during operation of the photodetecting device. Therefore, it is possible to reduce the temperature dependence of the potential barrier of a photodetecting section and lower the potential barrier of the embedding layers at high temperature. This makes it possible to manufacture a photodetecting device having a photodetecting section that achieves high sensitivity even when the photodetecting device is used under a high-temperature environment.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A photodetecting device having quantum dots, comprising:
    a quantum dot structure including a first embedding layer, and quantum dots embedded by said first embedding layer; and
    a quantum well structure formed at a location downstream of said quantum dot structure in a direction of flow of electrons which flow perpendicularly to said quantum dot structure during operation of the photodetecting device, said quantum well structure including second and third embedding layers, and a quantum well layer which is sandwiched between said second and third embedding layers, and whose band gap is smaller than those of said second and third embedding layers.

2. The photodetecting device according to claim 1, wherein said quantum dot structure and said quantum well structure are formed in an alternating manner a plurality of times in layers.

3. The photodetecting device according to claim 1, wherein aluminum gallium arsenide is used in forming said first, second, and third embedding layers.

4. The photodetecting device according to claim 1, wherein indium arsenide or indium gallium arsenide is used in forming said quantum dots.

5. The photodetecting device according to claim 1, wherein gallium arsenide is used in forming said quantum well layer.

6. A method of manufacturing a photodetecting device having quantum dots, the method comprising the steps of:
    forming a quantum dot structure including a first embedding layer, and quantum dots embedded by the first embedding layer; and
    forming a quantum well structure at a location downstream of the quantum dot structure in a direction of flow of electrons which flow perpendicularly to the quantum dot structure during operation of the photodetecting device, the quantum well structure including second and third embedding layers, and a quantum well layer which is sandwiched between the second and third embedding layers, and whose band gap is smaller than those of the second and third embedding layers.

7. The method according to claim 6, the quantum dot structure and the quantum well structure are formed in an alternating manner a plurality of times in layers.

8. The method according to claim 6, aluminum gallium arsenide is used in forming the first, second, and third embedding layers.

9. The method according to claim 6, indium arsenide or indium gallium arsenide is used in forming the quantum dots.

10. The method according to claim 6, gallium arsenide is used in forming the quantum well layer.

* * * * *